(12) United States Patent
Zachan et al.

(10) Patent No.: US 7,546,100 B2
(45) Date of Patent: Jun. 9, 2009

(54) SYSTEM FOR GENERATING AMPLITUDE MATCHED 45 DEGREE PHASE SEPARATED LOCAL OSCILLATOR SIGNALS

(75) Inventors: Jeffrey M. Zachan, Aliso Viejo, CA (US); Geoffrey Hatcher, Irvine, CA (US); Paul C. Mudge, Aliso Viejo, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 756 days.

(21) Appl. No.: 10/806,619

(22) Filed: Mar. 23, 2004

(65) Prior Publication Data

US 2005/0227636 A1    Oct. 13, 2005

(51) Int. Cl.
*H04B 1/16* (2006.01)
*H03C 1/52* (2006.01)

(52) U.S. Cl. .................. 455/205; 455/207; 455/108

(58) Field of Classification Search .................. 455/205, 455/207, 208, 257, 258, 73, 210, 213, 108, 455/116, 306, 307
See application file for complete search history.

(56) References Cited

U.S. PATENT DOCUMENTS

| 4,485,358 | A | * | 11/1984 | Andren et al. | ............... | 332/144 |
| 5,912,926 | A | * | 6/1999 | Koenck et al. | ............... | 375/295 |
| 5,963,607 | A | * | 10/1999 | Romano et al. | ............. | 375/373 |
| 6,396,345 | B2 | * | 5/2002 | Dolman | ...................... | 330/149 |
| 7,088,968 | B2 | * | 8/2006 | Zipper | ......................... | 455/126 |
| 7,123,897 | B2 | * | 10/2006 | Gorcea et al. | ............... | 455/333 |

\* cited by examiner

*Primary Examiner*—Eugene Yun

(57) ABSTRACT

A system for generating amplitude matched 45 degree phase separated signals is disclosed. Embodiments of the system for generating amplitude matched 45 degree phase separated signals include a filter arrangement including a plurality of nodes, an adjustable element associated with each node, the adjustable element configured to substantially equalize an amplitude of each vector associated with each node. The adjustable element may be an adjustable resistance or an adjustable capacitance associated with each node.

23 Claims, 5 Drawing Sheets

SYSTEM FOR GENERATING AMPLITUDE MATCHED 45 DEGREE PHASE SEPARATED LOCAL OSCILLATOR SIGNALS

BACKGROUND OF THE INVENTION

1. Field of the Invention

This invention relates generally to a portable transceiver. More particularly, the invention relates to generating amplitude matched 45 degree (45°) phase separated local oscillator signals.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset, also referred to as a portable transceiver. The different modulation and transmission schemes each have advantages and disadvantages.

As these mobile communication systems have been developed and deployed, many different standards have evolved, to which these systems must conform. For example, in the United States, many portable communications systems comply with the IS-136 standard, which requires the use of a particular modulation scheme and access format. In the case of IS-136, the modulation scheme is narrow band offset $\pi/4$ differential quadrature phase shift keying ($\pi/4$-DQPSK), and the access format is TDMA.

In Europe and emerging elsewhere, the global system for mobile communications (GSM) standard requires the use of the gaussian minimum shift keying (GMSK) modulation scheme in a narrow band TDMA access environment, which uses a constant envelope modulation methodology.

Portable transceivers operating in these various systems have been migrating from a methodology in which a baseband signal carrying data is first upconverted to an intermediate frequency (IF) prior to upconversion to radio frequency (RF) signal level at which the signal is transmitted to a system in which the data carrying baseband signal is upconverted directly to the RF frequency. Similarly, instead of being downconverted to an IF signal prior to being downconverted to baseband, many new portable transceivers downconvert a received RF signal directly to baseband. Such a portable transceiver is generally referred to as a "direct conversion receiver" and has many advantages over a portable transceiver that employs conversion to an IF signal as part of the transmit and receive signal processing.

Generally, in a direct conversion receiver, an oscillator supplies what is referred to as a "local oscillator" or "LO" signal to a mixer. The mixer downconverts the received RF signal to a baseband signal determined by the frequency of the local oscillator signal.

Some direct conversion receivers employ what is referred to as a "subharmonic mixer" to downconvert the received RF signal directly to a baseband signal from which the data contained in the signal may be reliably extracted. Conventional direct downconversion systems typically generate in-phase (I) and quadrature (Q) outputs using signals that are separated in phase by 90°. Because a subharmonic mixer effectively performs a multiply-by-two to the path containing the LO signal, the subharmonic mixer typically requires signals that are separated in phase by 45 degrees (°). Unfortunately, accurately generating the 45° offset phase signals has proven troublesome.

In one prior solution, a 90° phase shift inducing element is introduced into the RF signal path instead of requiring 45° separated LO signals. Unfortunately, this solution degrades the performance of the receiver by raising the noise figure. Another prior solution used a delay locked loop (DLL) to generate the 45° phase shifted signals. In a DLL, the LO signal drives a mixer and a buffer chain. The output of the mixer is integrated and the delay through the buffer chain is adjusted based on the output of the integrator. Unfortunately, a DLL adds significant complexity and consumes a large amount of power.

Therefore it would be desirable to efficiently and accurately generate the 45° phase shifted LO signals to supply to a subharmonic mixer.

SUMMARY

Embodiments of the system for generating amplitude matched 45 degree (45°) phase separated signals include a filter arrangement including a plurality of nodes, each node configured to provide an associated vector that is offset in phase from a vector associated with each other node, and an adjustable element associated with each node. The adjustable element configured to substantially equalize an amplitude of each vector associated with each node. The adjustable element may be an adjustable resistance or an adjustable capacitance associated with each node.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
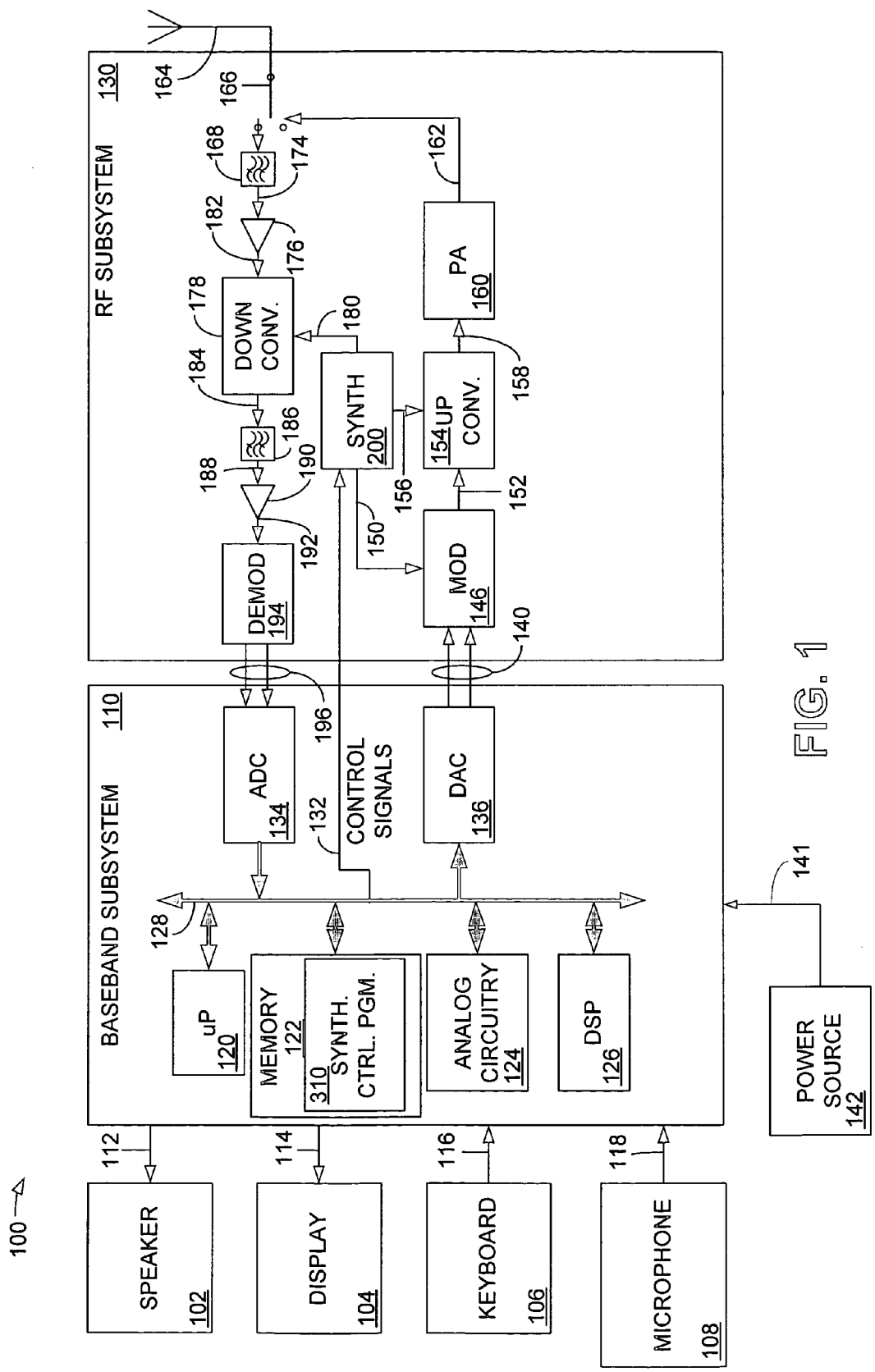
FIG. 1 is a block diagram illustrating a simplified portable transceiver.

Although described with particular reference to a portable transceiver, the system for generating amplitude matched 45 degree (45°) phase separated signals can be implemented in any system that uses phase shifted signals.

The system for generating amplitude matched 45° phase separated signals can be implemented in software, hardware, or a combination of software and hardware. In a preferred embodiment, the system for generating amplitude matched 45° phase separated signals may be implemented using hardware. The hardware can be implemented using specialized hardware elements and logic. If portions of the system for generating amplitude matched 45° phase separated signals are implemented in software, the software portion of the system for generating amplitude matched, phase shifted signals can be stored in a memory and be executed by a suitable instruction execution system (microprocessor). The hardware implementation of the system for generating amplitude matched 45° phase separated signals can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The software of the system for generating amplitude matched 45° phase separated signals comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including the system for generating amplitude matched 45° phase separated signals. The portable transceiver 100 shown in FIG. 1 is a simplified depiction of a portable transceiver and may include a variety of transceiver architectures. For example, the portable transceiver 100 may be a transceiver that implements signal upconversion and downconversion using an intermediate frequency (IF) or may include a direct launch transmitter and a direct conversion receiver in which the baseband transmit signals are converted directly to radio frequency (RF) transmit levels and in which RF receive signals are converted directly to baseband, referred to as a direct conversion receiver (DCR). Furthermore, the portable transceiver 100 may be one in which one or more voltage controlled oscillators are used for both transmit and receive (as in the case of a DCR) or in which individual VCOs are used for transmit and receive operation.

The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 141 to provide power to the portable transceiver 100. In a particular embodiment, portable transceiver 100 can be, for example but not limited to, a portable telecommunication handset such as a mobile/cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110. Microprocessor 120 and memory 122 generally provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132, and particularly, to the synthesizer 200 to be described below. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated herein.

Baseband subsystem 110 also includes analog-to-digital converter (ADC) 134 and digital-to-analog converter (DAC) 136. ADC 134 and DAC 136 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. Connection 140, while shown as two directed arrows, includes the information that is to be transmitted by RF subsystem 130 after conversion from the digital domain to the analog domain.

When portions of the system for generating amplitude matched 45° phase separated signals are implemented in software, the memory 122 also includes synthesizer control program 310. The synthesizer control program 310 is generally stored in the memory 122 and executed in the microprocessor 120. However, the synthesizer control program 310 may also be executed by the DSP 126. As will be described below, in one embodiment of the system for generating amplitude matched 45° phase separated signals, the synthesizer control program 310 adjusts an output of a voltage controlled oscillator (VCO) to provide substantially amplitude matched, phase shifted signals to a subharmonic mixer located in a downconverter.

RF subsystem 130 includes modulator 146, which, after receiving a frequency reference signal, also called a "local oscillator" signal, or "LO," from the synthesizer 200 via connection 150, modulates the received analog information and provides a modulated signal via connection 152 to upconverter 154. In a constant envelope modulation methodology, the modulated transmit signal generally includes only phase information. In a variable envelope modulation system, the modulated transmit signal may include both phase and amplitude information. Upconverter 154 also receives a frequency reference signal from synthesizer 200 via connection 156. Synthesizer 200 determines the appropriate frequency to which the upconverter 154 upconverts the modulated signal on connection 152. Depending on the implementation, the upconverter 154 may upconvert the modulated signal to an intermediate frequency prior to upconversion to an RF frequency. In other systems, the upconverter 154 may upconvert the modulated signal directly to an RF frequency. Further, depending on the modulation and upconversion methodology, various filters may be employed, but are omitted from FIG. 1 for simplicity.

Upconverter 154 supplies the modulated signal via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter pair (e.g., a duplexer) that allows simultaneous passage of both transmit signals and receive signals, as known in the art.

Although omitted for simplicity, a portion of the amplified transmit signal energy on connection 162 may be supplied to a power control element to control the output power level of the signal to be transmitted.

A signal received by antenna 164 is directed to receive filter 168. Receive filter 168 filters the received signal and supplies the filtered signal on connection 174 to low noise amplifier (LNA) 176. Receive filter 168 is a band pass filter, which passes all channels of the particular cellular system in which the portable transceiver 100 is operating. The purpose of this filter is to reject all frequencies outside the desired region. LNA 176 amplifies the comparatively weak signal on connection 174 to a level at which downconverter 178 can translate the signal from the transmitted frequency to an IF frequency, or directly to baseband in the case of a direct conversion receiver. Alternatively, the functionality of LNA 176 and downconverter 178 can be accomplished using other elements, such as, for example but not limited to, a low noise block downconverter (LNB).

Downconverter 178 receives a frequency reference signal, also called a "local oscillator" signal, or "LO," from synthesizer 200, via connection 180. The LO signal instructs the downconverter 178 as to the proper frequency to which to downconvert the signal received from LNA 176 via connection 182. Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the one-hundred twenty-four (124) contiguous channels is actually to be received. After all channels are passed by receive filter 168 and downconverted in frequency by downconverter 178, only the one desired channel will appear precisely at the center frequency of channel filter 186. The synthesizer 200, by controlling the local oscillator frequency supplied on connection 180 to downconverter 178, determines the selected channel.

Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing. As an alternative, the downconverted carrier frequency (IF frequency) at connection 184 may be 0 Hz, as would be the case with a direct conversion receiver. In such a case, the channel filter 186 is implemented as a low pass filter, and the demodulator 194 may be omitted.

Figure 2:
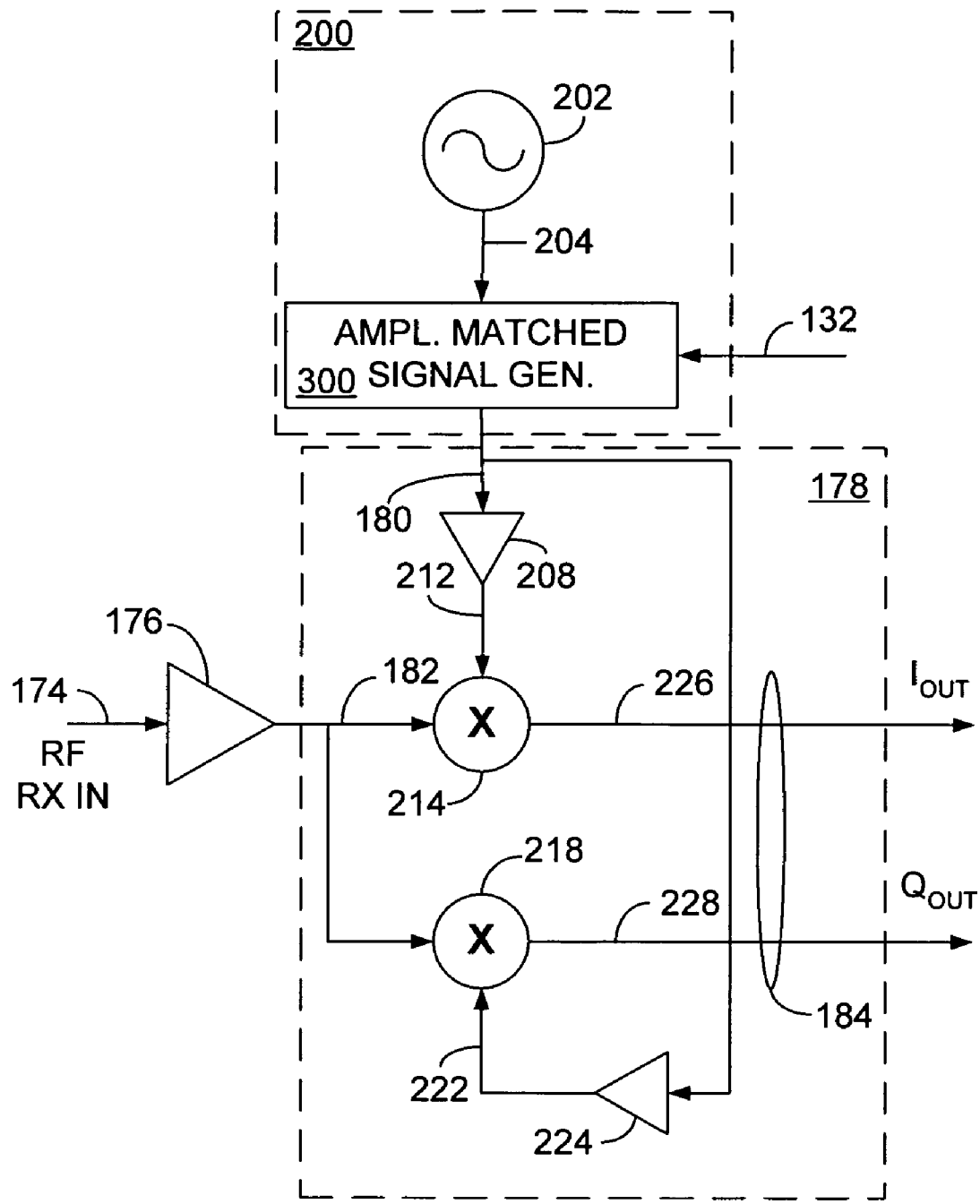
FIG. 2 is a block diagram illustrating an embodiment of the synthesizer and down converter of FIG. 1.

FIG. 2 is a block diagram illustrating an embodiment of the synthesizer 200 and down converter 178 of FIG. 1. The synthesizer 200 includes a voltage control oscillator (VCO) 202 which provides a voltage signal on connection 204 to the amplitude matched offset phase signal generator (hereafter referred to as amplitude matched signal generator) 300. The amplitude matched signal generator 300, as will be described in further detail below, provides, in this embodiment, eight (8) amplitude matched signals separated in phase by 45°, via connection 180 to the downconverter 178. The amplitude matched signal generator 300 also receives a control signal via connection 132 from the baseband subsystem 110 (of FIG. 1).

The downconverter 178 includes a pair of limiters 208 and 224, and a pair of mixers 214 and 218. In the case of a DCR, the mixers 214 and 218 are subharmonic mixers. The received radio frequency (RF) signal is supplied via connection 174 to the low noise amplifier 176. The low noise amplifier 176 amplifies the received signal and provides, on connection 182, the received radio frequency signal to mixers 214 and 218. The signals supplied from the limiter 208 to the mixer 214 and from the limiter 224 to the mixer 218 are referred to as the "local oscillator" or "LO" signals. In the case of a DCR in which subharmonic mixers are used, it is desirable that the LO signal on connection 180 comprise eight (8) vectors of 45° phase separated signals. As will be described below, the amplitude matched signal generator 300 provides highly accurate amplitude matched 45° phase separated signals to the mixers 214 and 218.

The mixer 214 downconverts the signal on connection 182 using the frequency information contained in the LO signal on connection 212, and provides the in-phase (I) portion of the received signal on connection 226. Similarly, the mixer 218 combines the signals on connections 182 and 222, and provides the quadrature (Q) portion of the received signal on connection 228. Collectively, the connections 226 and 228 form the output of the downconverter 178 on connection 184 (FIG. 1).

Figure 3A:
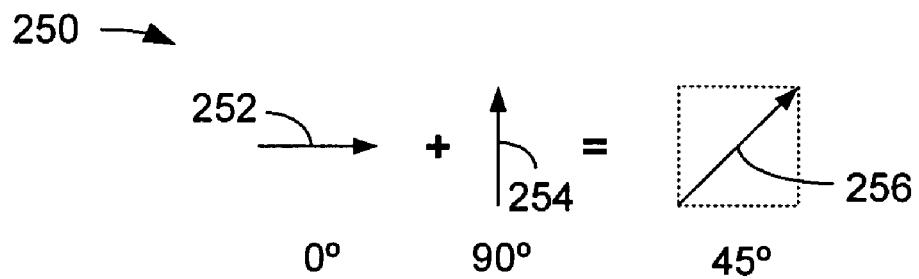
FIG. 3A is a graphical illustration showing the operation of the amplitude matched signal generator of FIG. 2.

FIG. 3A is a graphical illustration 250 showing the operation of the amplitude matched signal generator 300 of FIG. 2. For illustrative purposes, a vector 252 having a zero degree (0°) phase is added to a vector 254 having a ninety degree (90°) phase, resulting in a vector 256 having a forty-five degree (45°) phase. To ensure that the vector 256 occurs as close to forty-five degrees as possible it is important that the vectors 252 and 254 be substantially equal in amplitude. The amplitude matched signal generator 300 ensures that the vector 252 and the vector 254 are substantially equal in amplitude, so that the phase of the vector 256 will accurately resolve to forty-five degrees. It should be noted that the zero degree and ninety degree phases of vectors 252 and 254, respectively, are used for illustration purposes only, and that vectors having other phases can be combined by the amplitude matched signal generator 300 of FIG. 2.

Figure 3B:
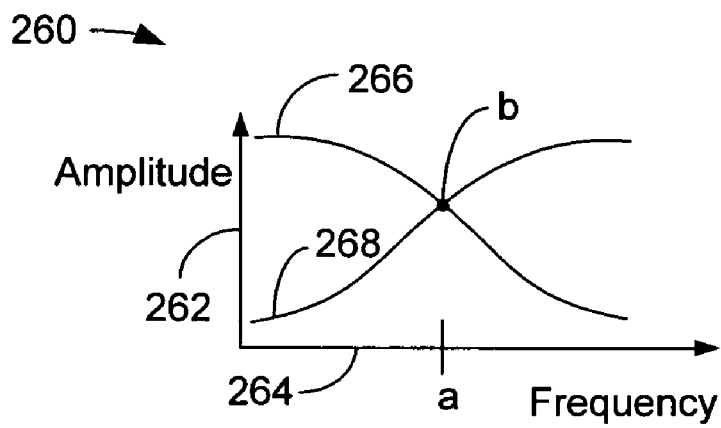
FIG. 3B is a graphical illustration to showing an amplitude perspective of the vectors of FIG. 3A.

FIG. 3B is a graphical illustration to 260 showing an amplitude perspective of the vectors 252 and 254 of FIG. 3A. The vertical axis 262 represents amplitude and the horizontal axis 264 represents frequency. The traces 266 and 268, which represent vectors 252 and 254 illustrate that the amplitude and phase of the two vectors 252 and 254 are both amplitude and phase matched only at point b, located at frequency a. In other words, amplitude matching of the two vectors represented by traces 266 and 268 occurs only at frequency a.

Figure 3C:
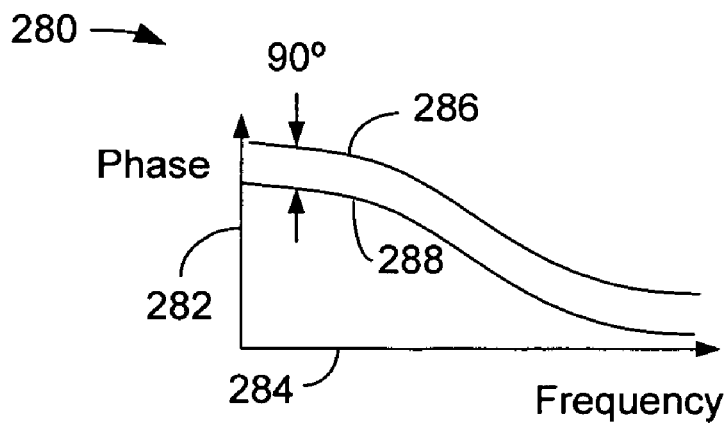
FIG. 3C is a graphical illustration showing a phase perspective of the vectors and of FIG. 3A.

FIG. 3C is a graphical illustration 280 showing a phase perspective of the vectors 252 and 254 of FIG. 3A. The vertical axis 282 represents phase and the horizontal axis 284 represents frequency. As shown, the traces 286 and 288, corresponding to the vectors 252 and 254, respectively, remain ninety degrees out of phase over the entire frequency spectrum, but have different amplitudes. Unfortunately, the amplitude difference prevents the two vectors from being mathematically combined to provide a vector 256 having the desired forty-five degree phase. When supplying an LO signal to a subharmonic mixer (FIG. 2) any amplitude variation between the vectors that are being combined to generate the 45° offset vectors, will likely result in a signal having vectors that are not separated in phase by 45°, thus reducing the performance of the subharmonic mixers in the downconverter.

Figure 4:
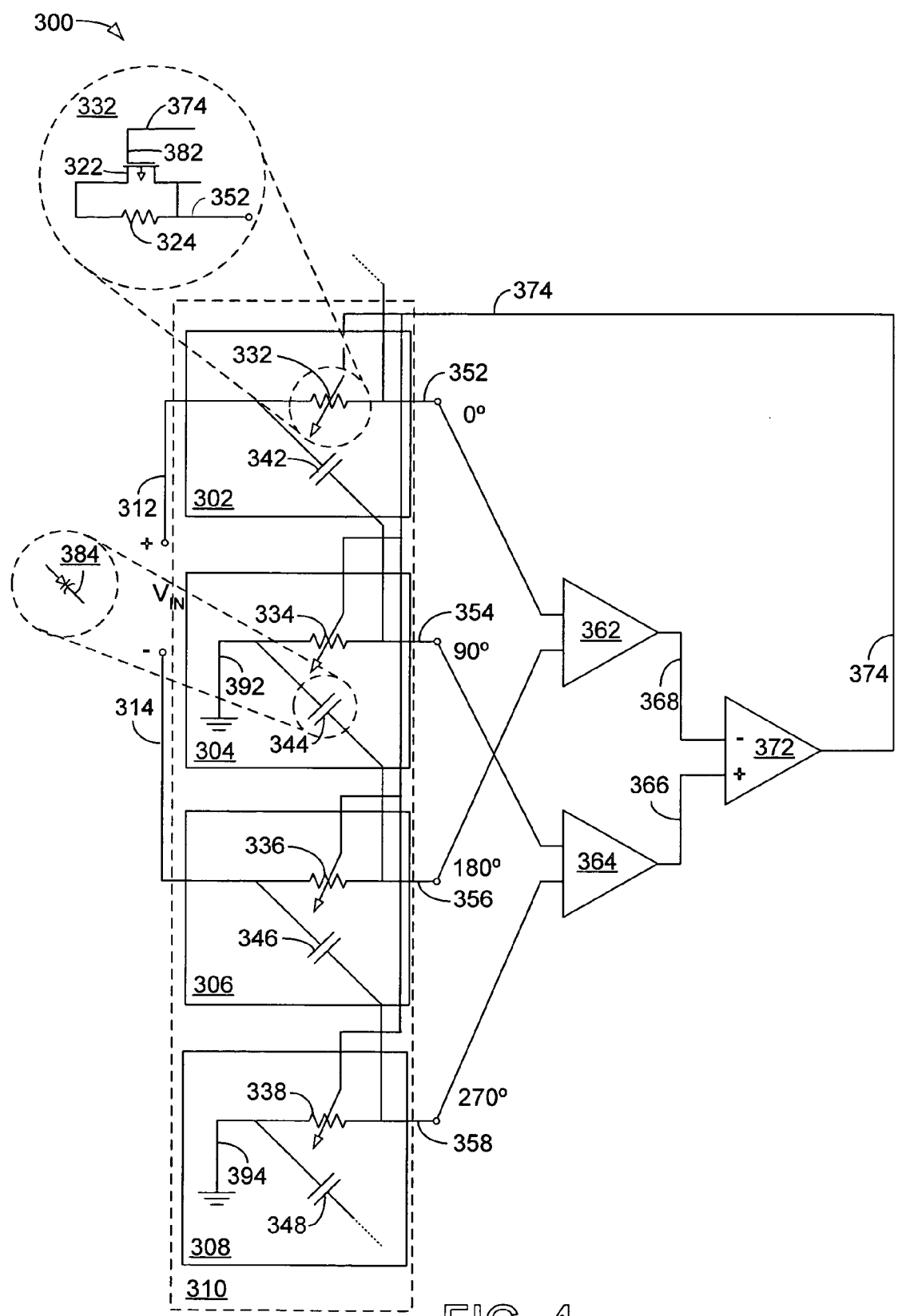
FIG. 4 is a block diagram illustrating the amplitude matched signal generator of FIG. 2.

FIG. 4 is a block diagram illustrating the amplitude matched signal generator 300 of FIG. 2. The amplitude signal generator 300 is illustrated as a filter arrangement employing resistive and capacitive elements. The filter performs what is referred to as a "Hilbert" transform to generate signals that are separated in phase by 90°. Such a filter arrangement is sometimes referred to as a "Hilbert" filter. One manner of implementing a Hilbert filter is referred to as a "polyphase" filter 310. As shown in FIG. 4, in one embodiment, a polyphase filter can be implemented using resistors and capacitors as an RC filter. The filter arrangement includes resistive (R) and capacitive (C) elements forming circuitry comprising four (4) nodes, the four nodes providing zero degree (0°), ninety degree (90°), one hundred and eighty degree (180°) and two hundred seventy degree (270°) outputs. The four nodes are shown in FIG. 4 as the zero degree node 352, the ninety degree node 354, the one hundred and eighty degree node 356, and the two hundred and seventy degree node 358. Each of the nodes is associated with an RC network, which comprises a resistive element and a capacitive element. Either the resistive element or the capacitive element may be variable to adjust the filter characteristics of each node. The superposition of two adjacent RC networks yields the desired signal vector at each of the nodes 352, 354, 356 and 358. By adjusting the electrical characteristics of each RC network 302, 304, 306 and 308, the amplitude of the signal vector appearing at nodes 352, 354, 356 and 358 can be adjusted and can thereby be substantially equalized in amplitude, as will be described below.

For example, the RC network 302 includes a variable resistance 332 and a capacitive element 342. While either or both of the resistive element 332 and the capacitive element 342 may be variable, in this embodiment, the resistive element 332 is variable. In this embodiment, the resistance of the resistive element 332 is controlled by a metal oxide semiconductor field effect transistor (MOSFET) 322. The combination of the MOSFET 322 and the resistance 324 is sometimes referred to as a "MOSFET resistor." The value of the resistance 332 is varied to adjust the filter parameters of the RC network 302. The value of the resistance 332 is varied by adjusting the current flow through the MOSFET 322, thereby adjusting the value of the resistor 324. The MOSFET 322 and the resistor 324 comprise the variable resistance 332. It should be mentioned that other types of variable resistances can be used to adjust the characteristics of the filter arrangement shown in FIG. 4.

Similarly, the RC network 304 includes a resistance 334 and a capacitance 344. The resistance 334 is variable and is similar to the resistance 332 described above. The RC network 306 includes a resistance 336 and a capacitance 346, and the RC network 308 includes a resistance 338 and a capacitance 348. In this embodiment, each of the resistances 334, 336 and 338 is variable as described above with respect to the resistance 332. Alternatively, the capacitance of each of the capacitive elements 342, 344, 346 and 348 can be adjusted using, for example, a varactor 384 shown in place of the capacitor 344.

The input to the amplitude matched signal generator 300 occurs via connections 312 and 314 and is referred to as $V_{IN}$. The RC network 304 is grounded via connection 392 and the RC network 308 is grounded via connection 394.

The output of the RC network 302 occurs on connection 352 and is a zero degree (0°) phase vector. The output of RC network 304 on connection 354 is a ninety degree (90°) phase vector. The output of RC network 306 on connection 356 is a one hundred and eighty degree (180°) phase vector and the output of RC network 308 on connection 358 is a two hundred seventy degree (270°) phase vector. In accordance with an aspect of the invention, the zero degree phase vector on connection 352 and the one hundred and eighty degree phase vector on connection 356 are supplied to a peak detector 362. The output of RC network 304 on connection 354 and the output of RC network 308 on connection 358 are supplied to peak detector 364. The peak detector 362 determines and records the maximum amplitude of the 0° and the 180° signal vectors, and the peak detector 364 determines and records the maximum amplitude of the 90° and the 270° signal vectors. The peak detectors 362 and 364 may be implemented using, for example, a pair of diodes, a resistor and a capacitor, or otherwise, as known in the art.

The output of the peak detector 362 is supplied via connection 368 to an inverting input of a comparator 372 while the output of the peak detector 364 is supplied via connection 366 to the non-inverting input of the comparator 372. The comparator 372 may be implemented using, for example, an operational amplifier (op-amp). The comparator 372 compares the level of the signals on connections 368 and 366 and provides a signal on connection 374 representing the difference of the signal levels on connections 368 and 366. For example, if the level of the signal on connection 368 is substantially equal to the level of the signal on connection 366, then the output of the comparator 372 would be zero. If the respective levels of the signals on connections 368 and 366 differ, the comparator 372 provides an error signal representing the difference on connection 374.

It is desirable that the amplitude of the signal vectors on connections 352, 354, 356 and 358 be substantially equal in magnitude. If the vectors are substantially equal in magnitude, then when two of the vectors are combined the result will be a vector having a phase substantially midway between the phase of the two vectors that were combined. However, due to process, temperature and other variations in the values of the components that comprise the RC networks 302, 304, 306 and 308, the signal vectors on connections 352, 354, 356 and 358 will differ in amplitude by some value. If these signals differ in amplitude and two of the vectors corresponding to two of these signals are combined, the resultant vector will occur at a phase that is not halfway between the phases of the combined vectors.

In accordance with an embodiment of the invention, the error signal output of the comparator 372 on connection 374 is used to adjust the characteristics of the filter nodes to substantially equalize the amplitude of the signal vectors on connections 352, 354, 356 and 358. In the embodiment shown in FIG. 4, the resistance of each RC network is varied by the error signal on connection 374 to substantially equalize the amplitude of the signal vectors on connections 352, 354, 356 and 358. For example, the signal on connection 374 is supplied to the gate terminal 382 of the MOSFET 322, and is supplied to the gate terminals of the MOSFETs associated with the RC networks 304, 306 and 308. By adjusting the value of the resistances 332, 334, 336 and 338 using the error signal output of the comparator 372, the resultant amplitude of the signal vectors at the outputs 352, 354, 356 and 358 are substantially equalized. In this manner, when the vectors on connections 352, 354, 356, and 358 are combined, the resultant vectors occur at the desired phase offset.

The feedback provided by the peak detectors 362, 364 and the comparator 372 allows the filter 310 to generate 90° phase shifted signals that have sufficiently matched amplitudes so that when summed, the vectors produce accurate 45° phase shifted signals over a broad range of frequencies. Such 45° phase shifted signals allow the use of subharmonic mixers in the receiver of a portable transceiver without degrading the minimum sensitivity of the receiver.

Process and temperature variations generally cause the values of the resistive and capacitive elements in the filter 310 to change, or skew, to a similar extent. In this embodiment, the signal on connection 374 is used to adjust each resistance in each RC network, so that global skew of the components is compensated. In accordance with an embodiment of the invention, adjusting the value of the resistances 332, 334, 336 and 338 compensates for the global skew of all the components in the filter to achieve amplitude and phase matching at the desired frequency (see FIG. 3B). When the amplitudes of the signal vectors on connections 352, 354, 356 and 358 are substantially equal, the vectors that result when two of the vectors on connections 352, 354, 356 and 358 are combined occur at a phase that is substantially midway between the phases of the vectors that were combined.

The operation of the amplitude matched signal generator 300 can be performed only upon power up of the device in which it is located to prevent noise from being introduced into the system, or can be dynamically performed to continually provide amplitude and phase matching.

Figure 5:
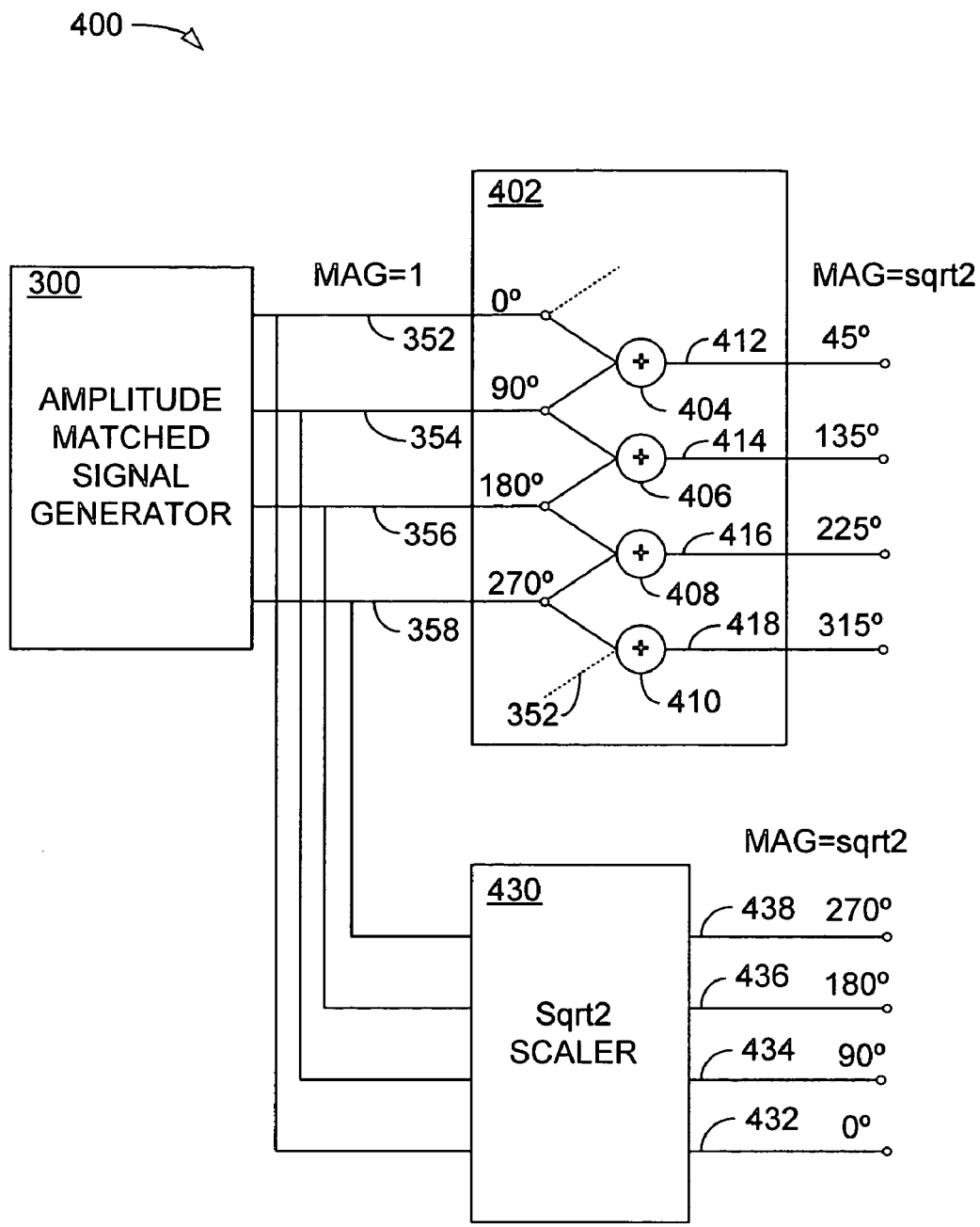
FIG. 5 is a block diagram illustrating the manner in which the vectors provided by the amplitude matched signal generator are combined.

FIG. 5 is a block diagram 400 illustrating the manner in which the vectors provided by the amplitude matched signal generator 300 are combined. The output of the amplitude matched signal generator 300 is supplied to a first adder element 402 and to a scaling element 430. The zero degree vector on connection 352 is combined with the ninety degree vector on connection 354 by adder 404 resulting in a forty five degree vector on connection 412. The ninety degree vector on connection 354 is combined with the one hundred eighty degree vector on connection 356 in adder 406, resulting in the one hundred thirty five degree vector on connection 414. Similarly, the one hundred eighty degree vector 356 is combined with the two hundred seventy degree vector on connection 358 by the adder 408, resulting in the two hundred twenty five degree vector on connection 416, while the two hundred seventy degree vector on connection 358 is combined with the zero degree vector on connection 352 by adder 410 resulting in a three hundred fifteen degree vector on connection 418.

Due to the operation of the peak detectors 362 and 364 and the comparator 372 (FIG. 4) the vectors on connections 352, 354, 356, and 358 are all substantially equal in magnitude and offset in phase by ninety degrees. However, when the ninety degree offset vectors are combined in the adder element 402 the resulting 45°, 135°, 225° and 315° vectors, while being equal to each other in magnitude, are not equal in magnitude to the original 0°, 90°, 180° and 270° vectors. For example, if the magnitude of the vectors on connections 352, 354, 356 and 358 are equal to 1, then the magnitude of the vectors on connections 412, 414, 416 and 418, will have a magnitude equal to $\sqrt{2}$. Unfortunately, if these eight vectors are used by the subharmonic mixers 214 and 218 (FIG. 2), then the amplitude mismatch will likely cause sub optimal system performance. Therefore, the vectors on connections 352, 354, 356 and 358 are supplied to the scaling element 430. The scaling element 430 scales the vectors on connections 352, 354, 356 and 358 by a factor equal to $\sqrt{2}$. In this manner, the 0°, 90°, 180° and 270° vectors on connections 432, 434, 436 and 438, respectively, are equal in magnitude to the 45°, 135°, 225° and 315° vectors on connections 412, 414, 416 and 418, respectively, and are separated in phase by 45°.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A system for generating amplitude matched, phase shifted signals, comprising:
   a filter arrangement including a plurality of input and output nodes, a first set of input nodes arranged to receive an input signal, a second set of input nodes coupled to electrical ground, each output node configured to provide an associated vector that is offset in phase from a vector associated with each other output node;
   a first peak detector arranged to receive a first pair of vectors from corresponding output nodes of the filter arrangement that are approximately 180° different in phase from each other, the first peak detector configured to generate a first peak signal;
   a second peak detector arranged to receive a second pair of vectors from corresponding output nodes of the filter arrangement that are approximately 180° different in phase from each other and different from the first pair of vectors, the second peak detector configured to generate a second peak signal;
   a comparator arranged to receive the first peak signal and the second peak signal and generate a feedback signal;
   an adjustable element associated with each output node, the adjustable element configured to receive the feedback signal and in response to the feedback signal substantially equalize an amplitude of each vector associated with each output node;
   an adder element arranged to receive the first pair of vectors and the second pair of vectors and configured to add respective vectors from the first and second pair of vectors each shifted in phase by approximately 90° from the other vector to generate corresponding adder outputs shifted in phase from the phase of the respective vectors from the first and second pair of vectors; and
   a scaler configured to receive the vectors associated with each output node and attenuate the amplitude of each of the same to generate a set of scaler outputs that are substantially equal in magnitude to the adder outputs.

2. The system of claim 1, wherein four output nodes are associated with the filter arrangement, each output node having an associated vector.

3. The system of claim 2, wherein the adder element is configured to add the four vectors resulting in eight phase shifted vectors.

4. The system of claim 3, wherein the scaler is configured to scale the amplitude of the four vectors resulting in eight amplitude matched phase shifted vectors.

5. The system of claim 4, wherein the adjustable element is an adjustable resistance.

6. The system of claim 5, wherein the adjustable resistance is a metal oxide semiconductor field effect transistor (MOSFET) adjustable resistance.

7. The system of claim 4, wherein the adjustable element is an adjustable capacitance.

8. The system of claim 7, wherein the adjustable capacitance is a varactor.

9. A method for generating amplitude matched, phase shifted signals, comprising:

providing a plurality of vectors, each vector associated with a respective output node, each vector offset in phase from each other vector associated with each other output node;

applying an input signal at a subset of a set of input nodes;

generating a first peak signal responsive to a first pair of vectors that are approximately 180° different in phase from each other;

generating a second peak signal responsive to a second pair of vectors different from the first pair of vectors, the second pair of vectors approximately 180° different in phase from each other;

generating a feedback signal responsive to the first peak signal and the second peak signal;

providing the feedback signal to a respective adjustable element associated with each input and output node;

adjusting each adjustable element using the feedback signal to substantially equalize an amplitude of each vector associated with each output node; and applying each vector to an adder element and to a scaler, wherein an output of the adder element is substantially equal in amplitude to an output of the scaler.

10. The method of claim 9, wherein the feedback signal is applied to a resistance to substantially equalize an amplitude of each vector associated with each output node.

11. The method of claim 10, further comprising adjusting the resistance using a metal oxide semiconductor field effect transistor (MOSFET) adjustable resistance.

12. The method of claim 9, wherein the feedback signal is applied to a capacitance to substantially equalize an amplitude of each vector associated with each output node.

13. The method of claim 12, further comprising adjusting the capacitance using a varactor.

14. A system for generating amplitude matched, phase shifted signals, comprising:

filter means including a plurality of input and output nodes, a first set of input nodes arranged to receive an input signal, a second set of input nodes coupled to electrical ground, the filter means for providing a plurality of associated vectors that are offset in phase from each other vector associated with each other output node;

means for generating a first peak signal responsive to a first pair of vectors that are approximately 180° different in phase from each other;

means for generating a second peak signal responsive to a second pair of vectors different from the first pair of vectors, the second pair of vectors approximately 180° different in phase from each other;

means for generating a feedback signal responsive to the first peak signal and the second peak signal;

means for providing the feedback signal to an adjustable element associated with each output node;

means for using the feedback signal to substantially equalize an amplitude of each vector associated with each output node;

means for applying each vector to an adder element; and means for applying each vector to a scaler, wherein an output of the adder element is substantially equal in amplitude to an output of the scaler.

15. The system of claim 14, wherein the means for substantially equalizing an amplitude of each vector comprises adjustable resistance means.

16. The system of claim 15, wherein the adjustable resistance means comprises a metal oxide semiconductor field effect transistor (MOSFET) adjustable resistance.

17. The system of claim 14, wherein the means for substantially equalizing an amplitude of each vector comprises adjustable capacitance means.

18. A system for generating amplitude matched, phase shifted signals, in a portable communication device, comprising:

a portable communication device including a transmitter and a receiver;

a synthesizer for providing a local oscillator signal;

a filter arrangement configured to operate on the local oscillator signal, the filter arrangement including a plurality of input and output nodes, a first set of input nodes arranged to receive the local oscillator signal, a second set of input nodes coupled to electrical ground, each output node configured to provide an associated vector that is offset in phase from a vector associated with each other output node;

a first peak detector arranged to receive a first pair of vectors from corresponding output nodes of the filter arrangement that are approximately 180° different in phase from each other, the first peak detector configured to generate a first peak signal;

a second peak detector arranged to receive a second pair of vectors from corresponding output nodes of the filter arrangement that are approximately 180° different in phase from each other and different from the first pair of vectors, the second peak detector configured to generate a second peak signal;

a comparator arranged to receive the first peak signal and the second peak signal and generate a feedback signal;

an adjustable element associated with each output node, the adjustable element configured to receive the feedback signal and in response to the feedback signal substantially equalize an amplitude of each vector associated with each output node;

an adder element arranged to receive the first pair of vectors and the second pair of vectors and configured to add respective vectors from the first and second pair of vectors wherein each respective vector is shifted in phase from the other to generate respective adder outputs shifted in phase from the phase of the first pair of vectors and the second pair of vectors; and a scaler configured to receive the vectors associated with each output node and attenuate the amplitude of each of the same to generate a set of scaler outputs that are substantially equal in magnitude to the adder outputs.

19. The system of claim 18, wherein four output nodes are associated with the filter arrangement, each output node having an associated vector.

20. The system of claim 18, wherein the adjustable element is an adjustable resistance.

21. The system of claim 20, wherein the adjustable resistance is a metal oxide semiconductor field effect transistor (MOSFET) adjustable resistance.

22. The system of claim 18, wherein the adjustable element is an adjustable capacitance.

23. The system of claim 22, wherein the adjustable capacitance is a varactor.

* * * * *